United States Patent [19]
Montgomery et al.

[11] Patent Number: 5,122,224
[45] Date of Patent: Jun. 16, 1992

[54] DIRECT FLOW CRYSTAL GROWTH SYSTEM

[75] Inventors: Kenneth E. Montgomery, Tracy; Fred P. Milanovich, Lafayette, both of Calif.

[73] Assignee: The United States of America as represented by the United States Department of Energy, Washington, D.C.

[21] Appl. No.: 428,538

[22] Filed: Oct. 30, 1989

[51] Int. Cl.[5] .............................................. C30B 7/08
[52] U.S. Cl. ................................... 156/621; 422/245; 23/302 R; 156/624; 156/DIG. 71; 156/DIG. 81; 156/DIG. 63
[58] Field of Search ...................... 422/245; 23/302 R; 156/621, 624, DIG. 71, DIG. 81, DIG. 63

[56] References Cited

U.S. PATENT DOCUMENTS

| | | | |
|---|---|---|---|
| 2,562,325 | 7/1951 | Merritt | 156/621 |
| 2,615,797 | 10/1952 | Bruzau | 23/302 R |
| 3,498,759 | 3/1970 | Kralik | 23/302 R |
| 3,560,168 | 2/1971 | Stanton | 23/302 R |
| 3,666,410 | 5/1972 | Aoyama et al. | 23/302 R |

OTHER PUBLICATIONS

Pamplin *Crystal Growth* second edition, Pergamon Press, New York, 1980 pp. 406–407.
Loiacono et al., "Growth of KH$_2$PO$_4$ Crystals at Constant Temperature and Supersaturation," Journal of Crystal Growth, vol. 62 (1983) pp. 545–556.
Bordui, "Growth of Large Single Crystals from Aqueous Solution: A Review," Journal of Crystal Growth, vol. 85 (1987) pp. 199–205.
Sasaki et al., "Influence of Bacteria in a Potassium Dihydrogen Phosphate Solution . . . ", Jap. Jour. of Applied Physics, vol. 26, No. 11, Nov. 1987, pp. L1767–L1769.

*Primary Examiner*—Robert Kunemund
*Attorney, Agent, or Firm*—Henry P. Sartorio; L. E. Carnahan; William R. Moser

[57] ABSTRACT

A crystal is grown in a constantly filtered solution which is flowed directly into the growing face of a crystal. In a continuous flow system, solution at its saturation temperature is removed from a crystal growth tank, heated above its saturation temperature, filtered, cooled back to its saturation temperature, and returned to the tank.

14 Claims, 2 Drawing Sheets

DIRECT FLOW CRYSTAL GROWTH SYSTEM

The United States Government has rights in this invention pursuant to Contract No. W-7405-ENG-48 between the U.S. Department of Energy and the University of California for the operation of the Lawrence Livermore National Laboratory.

BACKGROUND OF THE INVENTION

The invention relates to method and apparatus for growing crystals.

Large KDP crystals with high damage threshold are required for the NOVA and future high power lasers at LLNL. The crystals are used for frequency conversion to produce laser wavelengths which may be more optimum to produce laser fusion. Theoretically, a damage threshold of 80 $J/cm^2$ in 1 ns pulses can be reached. For the next generation laser, 40 $J/cm^2$ in 10 ns pulses is desired. However, the best crystals presently available, which are annealed, have a damage threshold of 15 $J/cm^2$ in 10 ns pulses.

Crystals are grown by placing a seed crystal in a crystal growth solution. In general, it is necessary to move the crystal growth solution over the crystal face to promote growth. It is also desirable to have the solution at substantially its saturation temperature when it contacts the crystal face. The motion of the solution over the crystal face is typically produced by a mechanical apparatus which either moves the crystal in the solution or moves the solution over the crystal. The means for producing this relative motion, unfortunately, introduce contaminants, e.g., particulates and organics. Any apparatus with metal parts, motors, and lubricated gears produces contaminants. The crystal growth solution at saturation temperature cannot be filtered to remove the contaminants since it will clog the filter.

SUMMARY OF THE INVENTION

Accordingly, it is an object of the invention to provide method and apparatus for growing high damage threshold crystals.

It is also an object of the invention to provide a crystal growth method and apparatus which constantly filters the crystal growth solution.

It is another object of the invention to provide a crystal growth method and apparatus which constantly filters the solution and also flows a near saturated solution over the crystal face.

The invention is a method and apparatus for growing crystals in which the solution is constantly filtered and the constantly filtered solution is flowed over the crystal face. The solution temperature is controlled so that it is substantially above saturation temperature while it is filtered but near saturation temperature when it contacts the crystal.

Crystal solution (at saturation temperature) is continuously pumped from the growth tank, heated above saturation temperature, filtered, exposed to UV light (optional), cooled back down to saturation temperature, and returned to the growth tank where it flows directly into the growing face of the crystal. The filtering system provides constant filtration along with constant flow, while controlling the temperature for filtration and crystal growth.

DETAILED DESCRIPTION OF THE PREFERRED EMBODIMENTS

Figure 1:
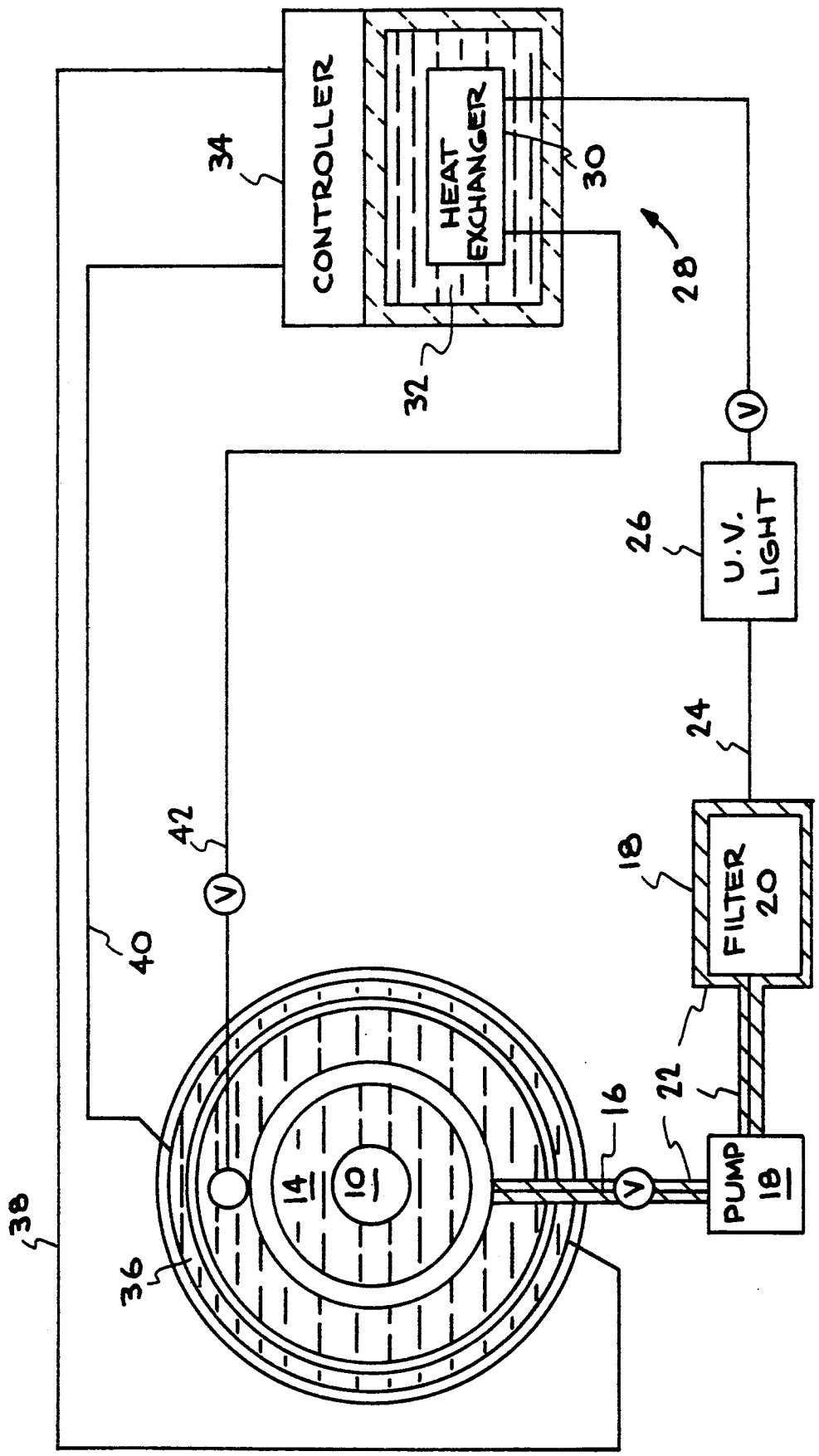
FIG. 1 is a schematic view of a direct flow crystal growth system.

As shown in FIG. 1, a crystal holder 10 extends into crystal growth tank 12 which is filled with crystal growth solution 14 at its saturation temperature. Solution 14 is continuously removed from tank 12 through solution outlet line 16 by means of pump 18. Line 15 is typically ¼" stainless steel. Line 16 extends to filter housing 18 which contains a filter 20. Suitable heating means 22 are associated with line 16 and housing 18 to heat the solution 14 removed from tank 12 to a predetermined temperature, typically about 5° C. above the solution saturation temperature. Heating means 22 may be heating tapes wrapped around the line 16. The heated solution flows through filter 20 in housing 18., filter 20 is preferably a 0.05 micron filter, e.g., made of polycarbonate. The solution passing through filter 20 has been heated sufficiently so that contaminants can be effectively removed but the solution is not near saturation so crystal growth material does not clog the filter.

The filtered solution is removed through line 24 which passes through an optional UV irradiation means 26 to cooling means 28. The optional UV irradiation means 26 may be a quartz tube with adjacent or surrounding UV lamp which operates at 235 nm. The UV lamp irradiates the filtered solution to kill any microorganisms present. Line 24 and all other lines and fittings following are preferably made of ¼" Teflon or similar material.

Cooling means 28 cools the heated filtered solution to the correct saturation temperature before it returns to the growth tank 12. The solution from line 24 passes through heat exchanger 30 in a temperature controlled water bath 32. Heat exchanger 30 may be simply a coil of suitable length, e.g., 25', of ¼" Teflon tubing which is submerged in bath 32. The temperature of water bath 32 is maintained by controller 34. Water bath 32 also supplies water to water jacket 36 which surrounds growth tank 12 to maintain solution 14 in the tank at its saturation temperature. Water flows from bath 32 to jacket 36 and back through water jacket inlet and outlet lines 38 and 40, respectively. The filtered solution at saturation temperature is returned from cooling means 28 to tank 12 through inlet line 42 which directs the solution flow onto the face of a crystal mounted in crystal holder 10.

Figure 2:
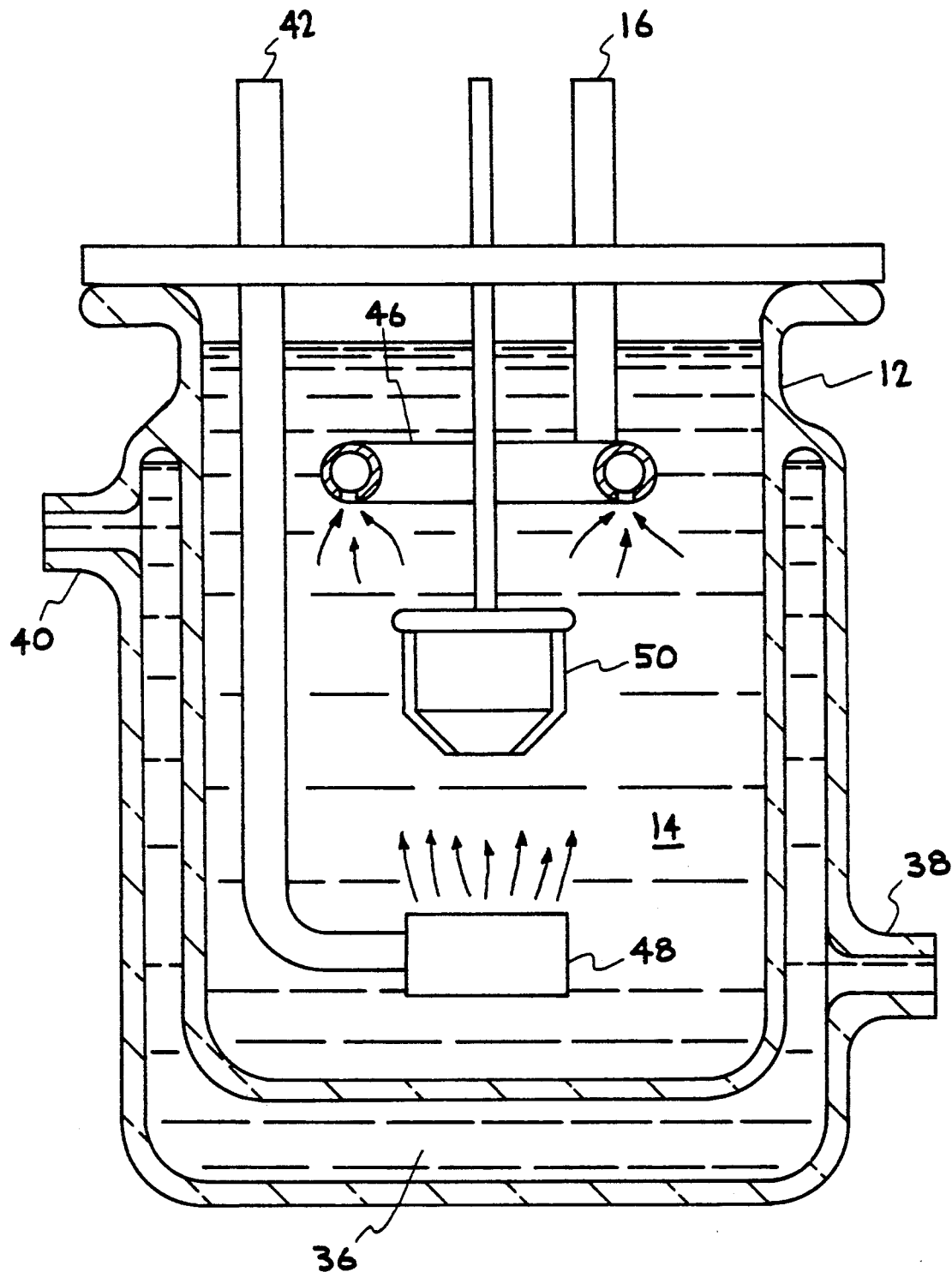
FIG. 2 is a sectional view of a direct flow crystal growth tank.

As shown in more detail in FIG. 2, crystal growth tank 12 is typically cylindrical, made of glass, and surrounded by water jacket 26 which is kept supplied with water at the saturation temperature of the crystal growth solution through inlet and outlet 38, 40. Tank 12 is covered by top 44 and filled with solution 14 which is maintained at substantially its saturation temperature by water jacket 36. Solution 14 is continuously removed from tank 12 by pickup ring 46 which is attached to outlet line 16 which extends through top 44. As solution is removed through pickup ring 46 for filtration, a like amount of filtered solution is returned to tank 12 through inlet line 42 which extends through top 44 and terminates in nozzle 48. A growing crystal 50 is mounted on seed holder 10 which extends through top 44 into tank 12. Nozzle 48 is positioned so that return filtered crystal growth solution is flowed directly upward into the growing face of crystal 50. Seed holder 10 is vertically adjustable to position crystal 50.

The lengths of the tank inlet line and water jacket inlet and lines can be selected to fine tune the temperature control.

The invention can be used to grow KDP and other crystals.

Changes and modifications in the specifically described embodiments can be carried out without departing from the scope of the invention which is intended to be limited only by the scope of the appended claims.

We claim:

1. A method of growing a crystal having increased damage threshold, in a crystal growth tank filled with crystal growing solution, comprising:
    maintaining the solution in the tank at substantially its saturation temperature;
    continuously removing solution from the tank;
    heating the solution removed from the tank to a predetermined temperature above the saturation temperature;
    filtering the heated solution through a 0.5 micron filter;
    cooling the filtered heated solution to substantially its saturation temperature;
    continuously returning the cooled filtered solution to the tank;
    wherein the steps of removing, filtering, cooling and returning are performed in a continuous flow system.

2. The method of claim 1 wherein the cooled filtered solution returning to the tank is directed against a growing crystal positioned in the tank.

3. The method of claim 1 wherein the solution removed from the tank is heated to about 5° C. above its saturation temperature.

4. The method of claim 1 further comprising irradiating the filtered heated solution with UV radiation prior to cooling.

5. A crystal growing apparatus for increasing damage threshold, comprising:
    a crystal growth tank;
    crystal mounting means positioned within the tank for holding a growing crystal;
    temperature control means operatively associated with the tank to maintain crystal growing solution in the tank at substantially its saturation temperature when the tank is filled with crystal growing solution;
    removal means for continuously removing solution from the tank when the tank is filled with crystal growing solution;
    heating means operatively associated with the removal means to heat solution removed from the tank to a predetermined temperature above the saturation temperature;
    filtering means comprising a 0.05 micron filter connected to the removal means for filtering the heated solution;
    cooling means connected to the filtering means for cooling filtered heated solution to substantially its saturation temperature;
    return means connected from the cooling means to the tank for continuously returning cooled filtered solution to the tank.

6. The apparatus of claim 5 wherein the removal means comprises a stainless steel line extending from the tank and a pump connected to the stainless steel line.

7. The apparatus of claim 6 wherein the heating means comprises heating tape wrapped around the stainless steel line.

8. The apparatus of claim 5 wherein the filtering means further comprises a filter housing and the 0.05 micron filter is mounted in the housing.

9. The apparatus of claim 5 further comprising a UV source positioned to irradiate heated filtered solution prior to cooling in the cooling means.

10. The apparatus of claim 9 wherein the UV source is a UV lamp at about 235 nm.

11. The apparatus of claim 5 wherein the cooling means comprises a temperature controlled water bath and a heat exchanger immersed in the bath.

12. The apparatus of claim 11 wherein the heat exchanger is a coiled tube.

13. The apparatus of claim 5 wherein the temperature control means is a water jacket surrounding the tank.

14. The apparatus of claim 5 wherein the return means is a return line from the cooling means extending into the tank, and a nozzle mounted on the end of the return line in the tank, and the nozzle is positioned relative to the mounting means to direct return solution flow against a growing crystal.

* * * * *